United States Patent
Chang et al.

(10) Patent No.: US 8,071,891 B2
(45) Date of Patent: Dec. 6, 2011

(54) INTERCONNECT STRUCTURE

(75) Inventors: Jung-Chan Chang, Sinshih Township, Tainan County (TW); Ding-Bing Lin, Taipei (TW)

(73) Assignee: Himax Media Solutions, Inc., Sinshih Township, Tainan County (TW)

( * ) Notice: Subject to any disclaimer, the term of this patent is extended or adjusted under 35 U.S.C. 154(b) by 255 days.

(21) Appl. No.: 12/392,227

(22) Filed: Feb. 25, 2009

(65) Prior Publication Data

US 2010/0212949 A1    Aug. 26, 2010

(51) Int. Cl.
*H05K 1/11* (2006.01)
(52) U.S. Cl. ........................ 174/262; 174/260
(58) Field of Classification Search ............. 174/255, 174/261, 262, 260; 361/760, 792–795; 333/1, 333/4, 5, 33, 238, 246
See application file for complete search history.

(56) References Cited

U.S. PATENT DOCUMENTS

| | | | |
|---|---|---|---|
| 6,531,661 B2 * | 3/2003 | Uchikawa et al. | 174/255 |
| 6,700,457 B2 * | 3/2004 | McCall et al. | 333/33 |
| 7,301,108 B2 * | 11/2007 | Egitto et al. | 174/262 |
| 2004/0150970 A1 | 8/2004 | Lee | |
| 2008/0116991 A1 * | 5/2008 | Gagnon et al. | 333/32 |
| 2009/0183909 A1 * | 7/2009 | Cho | 174/262 |

* cited by examiner

*Primary Examiner* — Yuriy Semenenko
(74) *Attorney, Agent, or Firm* — Thomas, Kayden, Horstemeyer & Risley, LLP

(57) ABSTRACT

A interconnect structure includes a substrate, a pair of interconnect pads, a pair of transmission lines. The substrate is stacked with at least one layer, and each of the layers has a first surface plane and a second surface plane. The pair of interconnect pads are formed on a first surface plane of a first layer of the substrate. The pair of transmission lines is formed on the first surface plane of the first layer, and the pair of transmission lines have a Y-type close trace portion for connection to the pair of interconnect pads. Further, the first surface plane of the layer is formed with a via hole which is formed within a groin region defined by the Y-type close trace portion and extends to a second surface plane of the first layer, wherein the second surface of the first layer is a power plane or a ground plane.

12 Claims, 4 Drawing Sheets

INTERCONNECT STRUCTURE

BACKGROUND

1. Field of Invention

The present invention relates to an interconnect structure for signal transmission. More particularly, the present invention relates to an interconnect structure with a pair of transmission lines for transmission of a pair of differential signals.

2. Description of Related Art

Signal transmission between a source and a load in a system may produce signal power transfer loss and signal reflection, if the output impedance of the source is not equal to the input impedance of the load. Impedance matching is the electronics design practice of setting the output impedance of the source equal to the input impedance of the load to which it is ultimately connected, usually in order to maximize the power transfer and minimize signal reflection from the load. Resisters, inductors and capacitors are considered for matching electrical impedance.

In high-speed communication systems, such as high-speed optoelectronic transceivers, even slight signal power transfer loss and signal reflection from the load can render the system failed.

One possible location where the signal transmission might have signal power transfer loss and signal reflection in a high-speed communication system is the interconnect for connection to the source or the load.

It would be desirable to reduce the impedance mismatching through the provision of a novel interconnect structure.

SUMMARY

According to one embodiment of the present invention, the interconnect structure includes a substrate, a pair of interconnect pads, a pair of transmission lines. The substrate is stacked with at least one layer, and each of the layers has a first surface plane and a second surface plane. The pair of interconnect pads is formed on a first surface plane of a first layer of the substrate. The pair of transmission lines is formed on the first surface plane of the first layer, and the pair of transmission lines have a Y-type close trace portion for connection to the pair of interconnect pads. Further, the first surface plane of the first layer is formed with a via hole which is formed within a groin region defined by the Y-type close trace portion and extends to a second surface plane of the layer, wherein the second surface plane is a power plane or a ground plane.

According to another embodiment of the present invention, the interconnect structure includes a substrate, a pair of transmission lines, and a pair of interconnect pads. The substrate is stacked with a plurality of layers, and each of the layers has two surface planes. The pair of interconnect pads are formed on a surface plane of a first layer of the substrate. The pair of transmission lines are formed on the surface plane of the first layer, and the pair of transmission lines have a Y-type close trace portion for connection to the pair of interconnect pads. Further, the surface plane of the first layer is formed with a via hole which is formed within a groin region defined by the Y-type close trace portion and extends to a surface plane of a second layer of the substrate, wherein the surface plane of a second layer is a power plane or a ground plane.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1A:
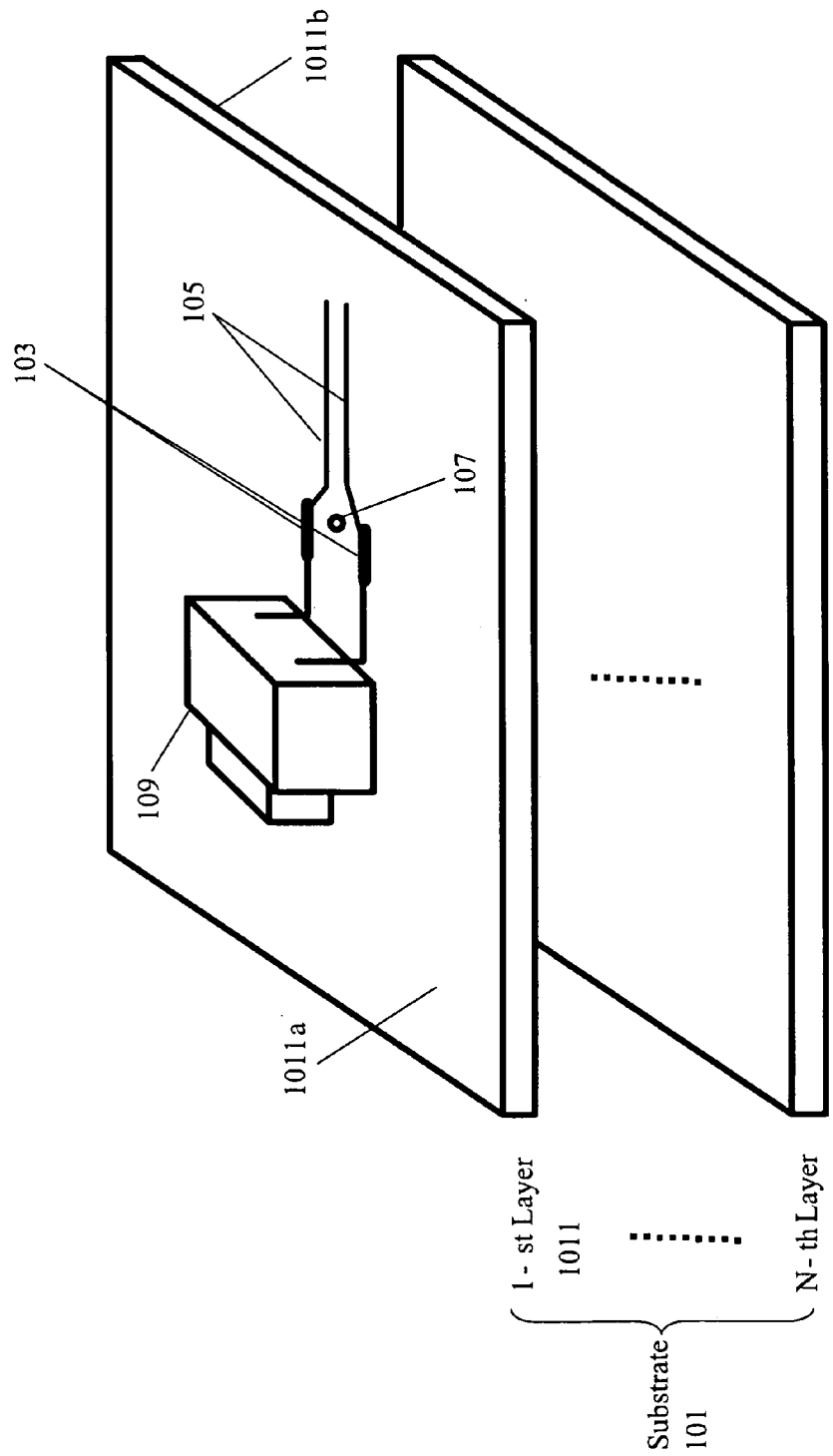
FIG. 1A shows the three dimensional view of an interconnect structure according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1C:
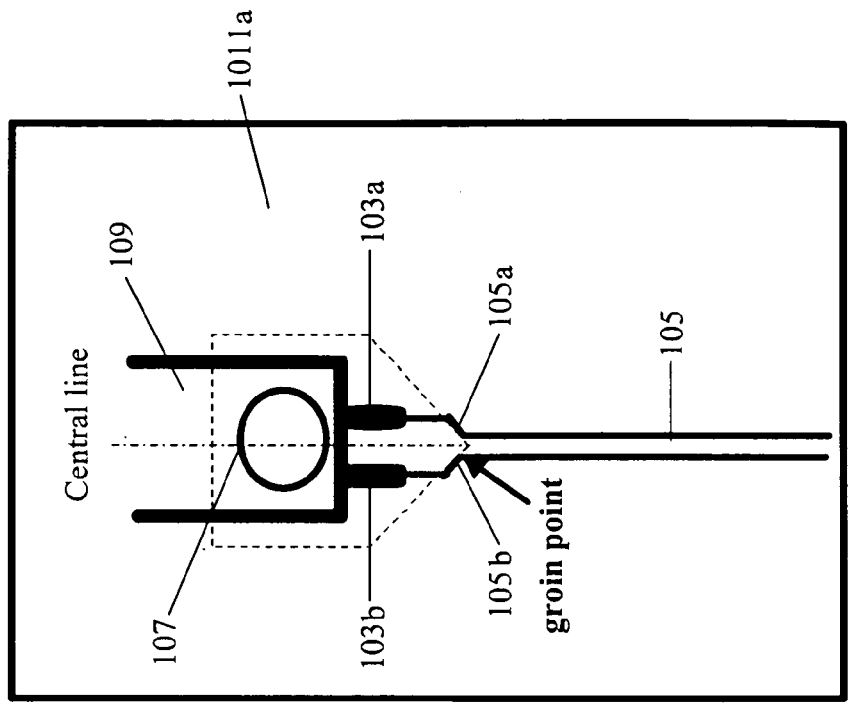
FIGS. 1B and 1C show the top views of the interconnect structure shown in FIG. 1A.
Figure 1B:
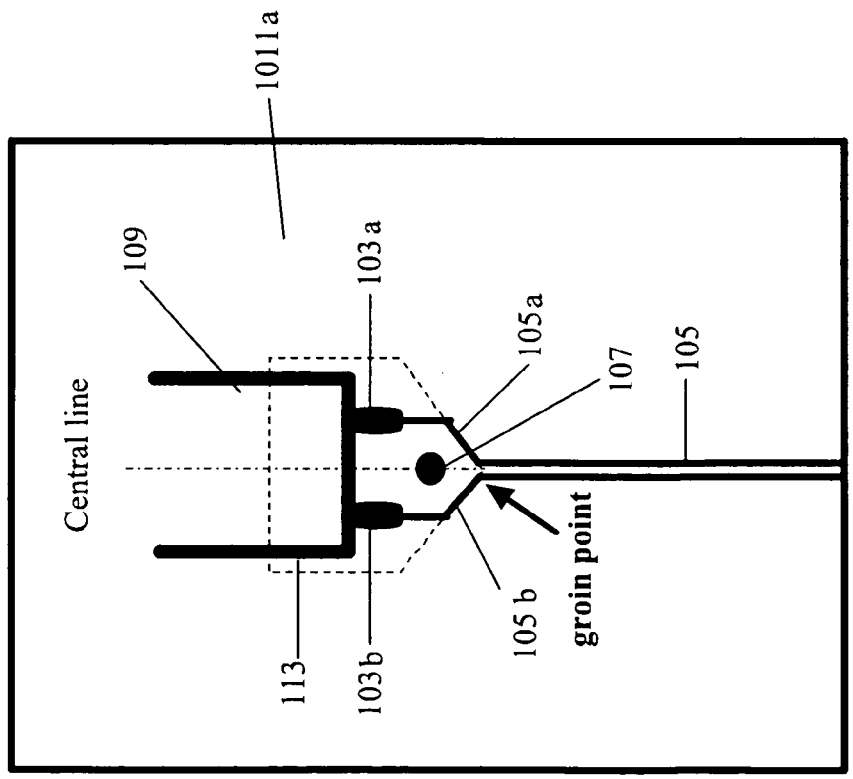

FIGS. 1A to 1C show an interconnect structure according one embodiment of the present invention. FIG. 1A shows the interconnect structure in three dimensional view, and FIGS. 1B and 1C show the top views of the interconnect structure.

The interconnect structure in FIG. 1A includes a substrate 101, a pair of interconnect pads 103, a pair of transmission lines 105, and a device 109 such as a surface mounted device (SMD), an IC package, a connector, an adapter or the like. The substrate 101, such as a printed circuited board (PCB), is stacked with at least one layer, and each layer has a first surface plane and a second surface plane. The first layer 1011 has a first surface plane 1011a and a second surface plane 1011b. The pair of interconnect pads 103 and the pair of transmission lines 105 are formed on the first surface plane 1011a. The pair of transmission lines 105 have a Y-type close trace portion for connection to the pair of the interconnect pads 103. In another way, the pair of interconnect pads 103 can couple to pins of the device 109 through interconnect via holes (if the device 109 is not formed on the same surface plane as the interconnect pads 103 and the pair of transmission lines 105), or solder balls (if the device 109 is formed on the same surface plane as the interconnect pads 103 and the pair of transmission lines 105, as shown in FIG. 1A). The first surface plane 1011a is formed with a via hole 107 which is formed within a groin region 113 defined by the Y-type close trace portion as shown in FIG. 1B, and the formed via hole 107 extends to the second surface plane 1011b of the first layer 1011. The second surface plane 1011b can be a power plane providing a supply voltage or a ground plane providing a ground voltage. The formed via hole 107 in this embodiment of the present invention may be a blind via hole, a buried via hole or a through via hole. In more detail, the formed via hole 107 is the through via hole, if the substrate 101 includes only the first layer 1011. The formed via hole 107 is the buried via hole if the first layer 1011 is an intermediate layer of the substrate 101 stacked with three or more layers. The formed via hole 107 is the blind via hole, if the first layers 1011 is the topmost or bottommost layer of the substrate 101 stacked with two or more layers.

In FIG. 1B, the pair of transmission lines 105 includes a Y-type close trace portion 105a and 105b for connection to the pair of interconnect pads 103 (103a and 103b). The Y-type close trace portion 105a and 105b couples to the interconnect pad 103a and 103b, respectively. The pair of interconnect pads 103 (103a and 103b) may be solder ball pads, interconnect via pads, SMD interconnect pads, or IC package pin pads. The groin region 113 may be formed as a pentagon (like home plate), and the Y-type close trace portion 105a and 105b, the pair of interconnect pads 103 (103a and 103b), and the formed via hole 107 are within the groin region 113. In more detail, the formed via hole 107 is located between the interconnect pads 103 (103a and 103b) or the Y-type close trace portion 105a and 105b, preferably along a central line of the transmission lines 105 or the Y-type close trace portion 105a and 105b, and approaches to the groin point of the Y-type close trace portion 105a and 105b.

The outcome for reducing the impedance mismatch corresponds to the distance between the formed via hole 107 and the groin point of the Y-type close trace portion 105a and 105b; the nearer, the better. In some conditions, the Y-type close trace portion 105a and 105b may be too close to form the via hole 107 between them, and the via hole 107 may be formed below the device 109, only if the via hole 107 is formed along a central line of the Y-type close trace portion 105a and 105b and approaching the groin point, as shown in FIG. 1C.

Figure 2A:
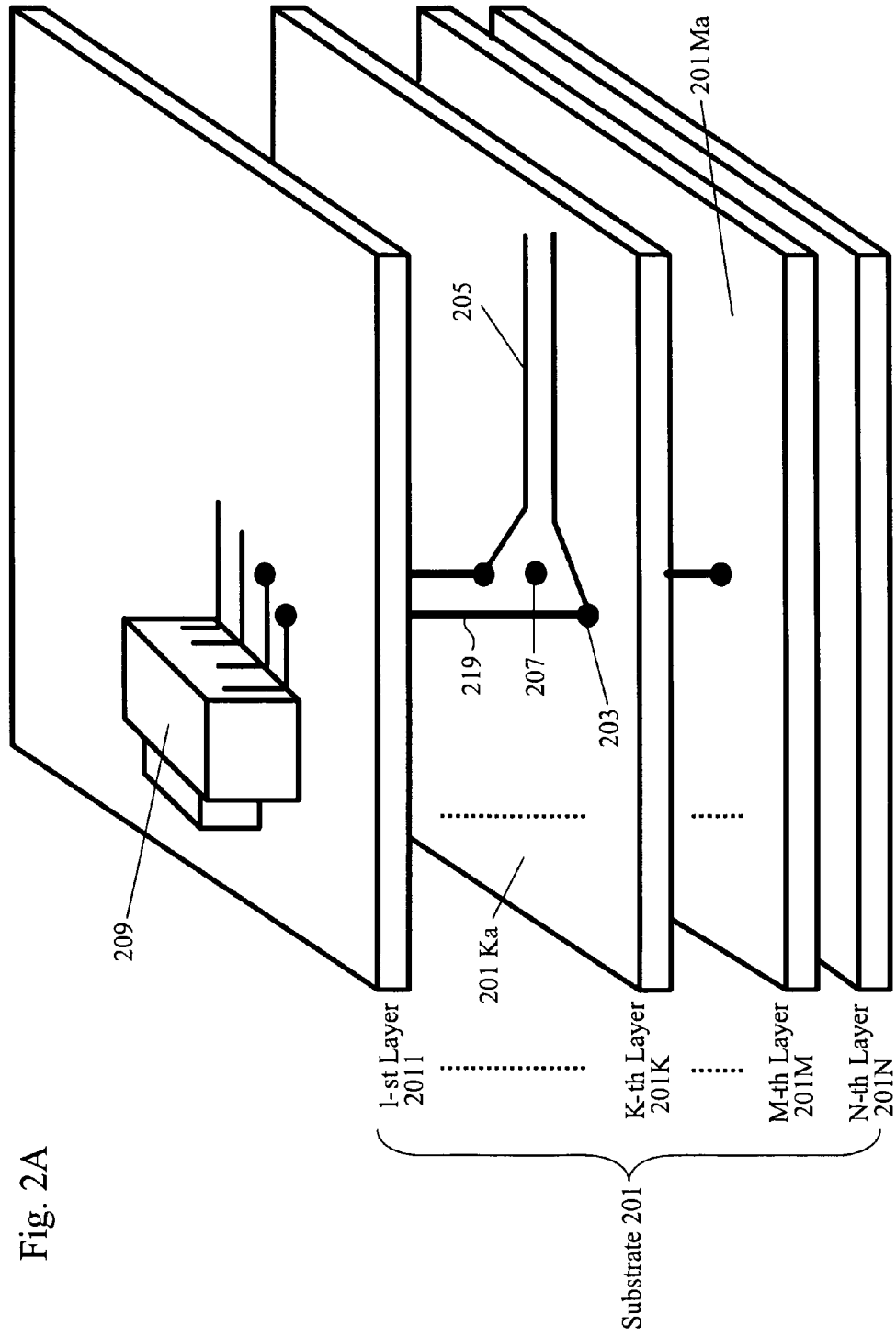
FIG. 2A shows the three dimensional view of an interconnect structure according to another embodiment of the present invention.
Figure 2B:
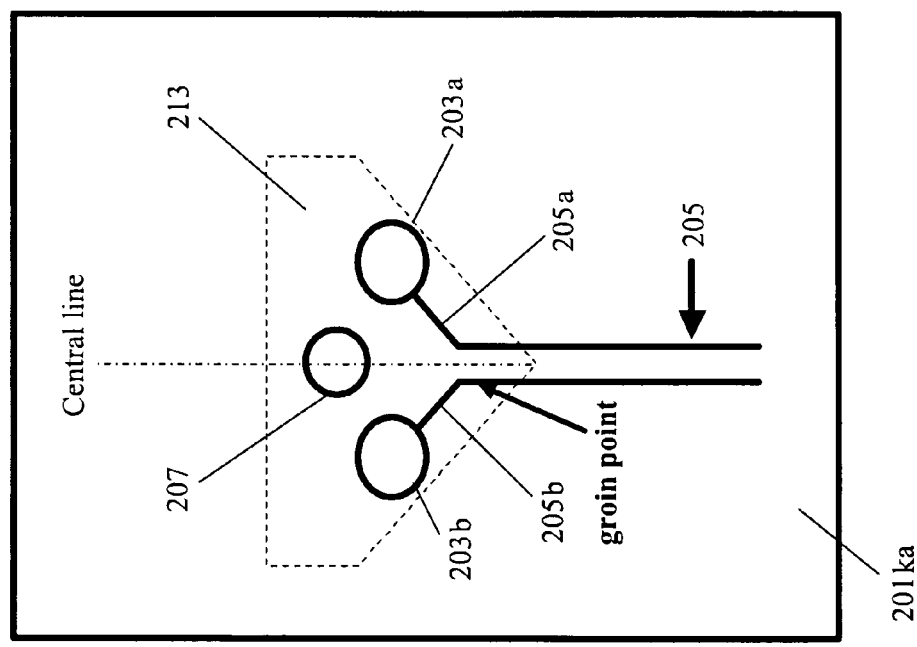
FIG. 2B shows the top view of the interconnect structure according to the embodiment shown in FIG. 2A.

FIGS. 2A and 2B show an interconnect structure according to another embodiment of the present invention. FIG. 2A shows the three dimensional view of the interconnect structure, and FIG. 2B shows the top view of the interconnect structure.

The interconnect structure in FIG. 2A includes a substrate 201, a pair of interconnect pads 203, a pair of transmission lines 205, a device 209. The substrate 201, such as a PCB, is stacked with a plurality of layers, and each layer has two surface planes. The pair of interconnect pads 203 and the pair of transmission lines 205 are formed on a first surface plane 201Ka of a K-th layer 201K, and the pair of transmission lines 205 have a Y-type close trace portion for connection to the pair of interconnect pads 203. The pair of interconnect pads 203 further couple to pins of the device 209 through interconnect via 219 (if the device 209 is not formed on the same surface plane as the interconnect pads 203 and the pair of transmission lines 205, as shown in FIG. 2A), or solder balls (if the device 209 is formed on the same surface plane as the interconnect pads 203 and the pair of transmission lines 205). The first surface plane 201Ka is formed with a via hole 207 which is formed within a groin region 213, as shown in FIG. 2B, defined by the Y-type close trace portion, and the formed via hole 207 extends to a first surface plane 201Ma of a M-th layer 201M of the substrate 201. The first surface plane 201Ma is a power plane providing a supply voltage or a ground plane providing a ground voltage. The formed via hole 207 may be a blind via hold, a buried via hole or a through via hold. In more detail, the formed via hole 207 is the through via hole, if the first surface plane 201Ka is the topmost/bottommost surface plane of the substrate 201, and the first surface plane 201Ma is the bottommost/topmost surface plane of the substrate 201. The formed via hole 207 is the blind via hole, if the first surface plane 201Ka of the K-th layer 201K is the topmost/bottommost surface of the substrate 201, and the first surface plane 201Ma is an intermediate surface plane of the substrate 201, or if the first surface plane 201Ma of the M-th layer 201M is an the topmost/bottommost surface of the substrate 201 and the first surface plane 201Ka is an intermediate surface plane of the substrate 201. The formed via hole 107 is the buried via hole, if both of the first surface planes 201Ka and 201Ma are intermediate surface planes of the substrate 201.

In FIG. 2B, the pair of transmission lines 205 include a Y-type close trace portion 205a and 205b for connection to the pair of interconnect pads 203 (203a and 203b). The pair of interconnect pads 203 may be solder ball pads, interconnect via pads, SMD interconnect pad, or IC package pin pads. The groin region 213 may be formed as a pentagon (like home plate), and the Y-type close trace portion 205a and 205b, the pair of interconnect pads 203 (203a and 203b), and the formed via hole 207 are formed within the groin region 213. In more detail, the formed via hole 207 is located between the interconnect pads 203 (203a and 203b) or the Y-type close trace portion 205a and 205b, preferably along a central line of the transmission lines 205 or the Y-type close trace portion 205a and 205b, and approaches to the groin point of the Y-type close trace portion 205a and 205b. The outcome for reducing the impedance mismatch corresponds to the distance between the formed via hole 207 and the groin point of the Y-type close trace portion; the nearer, the better.

With the via hole 107/207 formed within the groin region 113/213 defined by the Y-type close trace portion and extending to power/ground planes, the impedance mismatch phenomenon can be reduced. Preferably, the via hole 107/207 is located along a central line of the transmission lines or the Y-type close trace portion and approaching the groin point.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An interconnect structure, comprising:
a substrate comprising a first layer, wherein the first layers has a first surface plane and a second surface plane;
a pair of interconnect pads formed on the first surface plane of the first layer of the substrate; and
a pair of differential signal transmission lines formed on the first surface plane of the first layer, the pair of differential signal transmission lines having a Y-type close trace portion for connection to the pair of interconnect pads and connected to the pair of interconnect pads at open ends of the Y-type close trace portion,
wherein the first surface plane of the first layer is formed with a via hole which is formed within a groin region defined by the Y-type close trace portion and extends to the second surface plane of the first layer, the second surface plane being a power plane or a ground plane while the first surface plane being a non-ground plane.

2. The interconnect structure of claim 1, wherein the via hole is a through via hole if the substrate only has the first layer.

3. The interconnect structure of claim 1, wherein the via hole is a blind via hole if the first layer is an intermediate layer stacked with other layers of the substrate.

4. The interconnect structure of claim 1, wherein the via hole is a buried via hole if the first layer stacked with other layer of the substrate is topmost layer or bottommost layer.

5. The interconnect structure of claim 1, wherein the substrate is a printed circuited board (PCB).

6. The interconnect structure of claim 1, wherein the pair of interconnect pads are solder ball pads, interconnect via pads, pin pads, SMD interconnect pads, or IC package pin pads.

7. An interconnect structure, comprising:
a substrate comprising a plurality of layers, each of the layers having two surface planes, wherein one of the layers is defined as a first layer, another one of the layers is defined as a second layer;

a pair of interconnect pads formed on one of the surface planes of the first layer of the substrate; and a pair of differential signal transmission lines formed on the one of the surface planes of the first layer with the pair of interconnect pads formed on, the pair of differential signal transmission lines having a Y-type close trace portion for connection to the pair of interconnect pads and connected to the pair of interconnect pads at open ends of the Y-type close trace portion, wherein the one of the surface planes of the first layer with the pair of interconnect pads formed on is formed with a via hole which is formed within a groin region defined by the Y-type close trace portion and extends to one of the surface planes of the second layer of the substrate in which the one of the surface planes of the first layer with the pair of interconnect pads formed on is a non-ground plane while the one of the surface planes of the second layer is a power plane or a ground plane.

8. The interconnect structure of claim 7, wherein the via hole is a through via hole if the one of the surface planes of the first layer with the pair of interconnect pads formed on is a topmost/bottommost surface plane of the substrate, and the one of the surface planes of the second layer is the bottommost/topmost surface plane of the substrate.

9. The interconnect structure of claim 7, wherein the via hole is a blind via hole if the one of the surface planes of the first layer with the pair of interconnect pads formed on is a topmost/bottommost surface of the substrate and the one of the surface planes of the second layer is an intermediate surface plane of the substrate, or if the one of the surface planes of the second layer is the topmost/bottommost surface of the substrate and the one of the surface planes of the first layer with the pair of interconnect pads formed on is an intermediate surface plane of the substrate.

10. The interconnect structure of claim 7, wherein the via hole is a buried via hole if the surface planes of the first and second layers are intermediate surface planes of the substrate.

11. The interconnect structure of claim 7, wherein the substrate is a printed circuited board (PCB).

12. The interconnect structure of claim 7, wherein the pair of interconnect pads are solder ball pads, interconnect via pads, SMD interconnect pads, or IC package pin pads.

* * * * *